United States Patent
Nakazawa

[11] Patent Number: 5,939,948
[45] Date of Patent: Aug. 17, 1999

[54] PHASE LOCKED LOOP CIRCUIT AND REPRODUCING APPARATUS

[75] Inventor: Tetsuji Nakazawa, Kanagawa, Japan

[73] Assignee: Sony Corporation, Tokyo, Japan

[21] Appl. No.: 09/036,537

[22] Filed: Mar. 6, 1998

Related U.S. Application Data

[30] Foreign Application Priority Data

Mar. 11, 1997 [JP] Japan ................................. 9-056027

[51] Int. Cl.⁶ .............................. H03L 7/087; H03L 7/10
[52] U.S. Cl. ................................. 331/11; 331/14; 331/17; 331/25; 360/51
[58] Field of Search ............................... 331/1 A, 11, 14, 331/17, 23, 25; 360/51; 375/376

[56] References Cited

U.S. PATENT DOCUMENTS

| | | | |
|---|---|---|---|
| 4,918,404 | 4/1990 | Vitiello et al. | 331/11 |
| 5,265,081 | 11/1993 | Shimizume et al. | 369/48 |
| 5,334,954 | 8/1994 | Koblitz et al. | 331/20 |
| 5,530,389 | 6/1996 | Rieder | 327/156 |
| 5,841,323 | 11/1998 | Fujimoto | 331/11 |

FOREIGN PATENT DOCUMENTS

0357374 A2  3/1990  European Pat. Off. ........ H03L 7/107

*Primary Examiner*—David Mis
*Attorney, Agent, or Firm*—Limbach & Limbach L.L.P.

[57] ABSTRACT

A phase locked loop circuit for absorbing characteristic variations of phase comparator components beforehand in adjusting mode. With the variations thus adjusted and co-opted, any intrinsic error of the phase comparator is prevented from appearing as a phase difference upon transition from adjusting mode to normal operation mode. The scheme inhibits lock range deviations or capture range variations in normal operation mode, permitting a stable phase locked loop function.

11 Claims, 5 Drawing Sheets

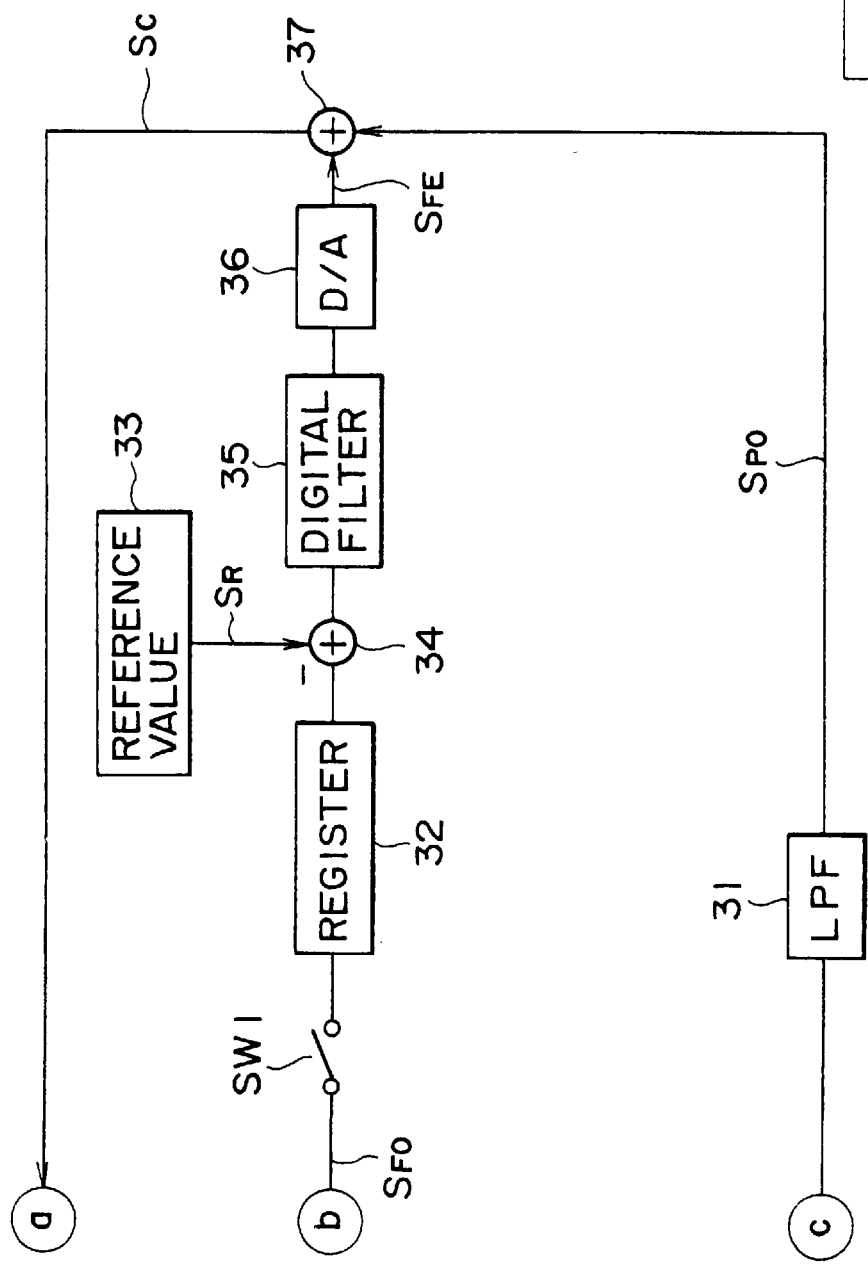

F I G. 4

|  | SWITCH SW1 | SWITCH SW2 |
|---|---|---|
| ADJUSTING MODE | ON | T1 → T2 |
| NORMAL OPERATION MODE | OFF | T1 → T3 |
| SUSTAINING MODE | OFF | T1 → T2 | ically adjusting the center frequency of a voltage
PHASE LOCKED LOOP CIRCUIT AND REPRODUCING APPARATUS

BACKGROUND OF THE INVENTION

The present invention relates to a phase locked loop (PLL) circuit capable of generating an oscillation frequency based on an input signal such as a synchronizing signal, as well as to a reproducing apparatus incorporating that PLL circuit to produce a regenerative clock signal.

There exist reproducing apparatuses that deal with disk type storage media such as optical disks and magneto-optical disks and those that address tape type storage media such as magnetic tapes. Such reproducing apparatuses need a regenerative clock signal for bit extraction in decoding read data from the respective storage media. A clock signal synchronized with such read data is extracted generally by the PLL circuit. Some PLL circuits are known to be capable of automatically adjusting the center frequency of a voltage controlled oscillator (VCO).

FIG. 1 is a block diagram of a PLL circuit having such an automatic adjusting function. This is a PLL circuit that extracts a regenerative clock signal from an EFM (eight-fourteen modulation) signal in synchronism with that signal. The EFM is a modulation scheme adopted illustratively by CD (compact disk) players.

In FIG. 1, a crystal oscillator 41 has a built-in crystal resonator that outputs an oscillation frequency serving as a reference frequency. The reference frequency outputted by the crystal oscillator 41 is divided by a divider 42 having a predetermined dividing ratio. The divided output is inputted as a divided frequency signal S1 to a frequency counter 43.

Meanwhile, a voltage controlled oscillator (VCO) 44 has its oscillation frequency controlled by an output of an adder 53, to be described later. The output of the voltage controlled oscillator 44 is divided by another divider 45 having a predetermined dividing ratio. The output of the divider 45 is branched and inputted as a divided frequency signal S2 both to the frequency counter 43 and to a phase comparator 46.

The phase comparator 46 receives the divided frequency signal S2 as well as a binary EFM signal outputted by an EFM block 46. The EFM block 46 generates and outputs the binary EFM signal based on a reproduced RF signal read from a disk, not shown.

The phase comparator 47 compares the two input signals in terms of phase and supplies a detection output accordingly to a low-pass filter 47. The low-pass filter 48 filters the detection output from the phase comparator 47 and outputs an error signal $S_{PO}$ to the adder 53.

The frequency counter 43 compares the divided frequency signal S1 from the crystal oscillator 41 with the divided frequency signal S2 from the VCO 44 in terms of phase, and counts the frequency of the divided output of the VCO 44. A count result signal $S_{FO}$ of the frequency counter 43 is inputted to an adder 50 via a switch SW1. A reference value register 49 is set in advance with a reference value SR corresponding to a predetermined reference frequency based on an appropriate center frequency to be established for the VCO 44. The adder 50 subtracts the count result of the frequency counter 43 from the reference value in the reference value register 49. That is, the adder 50 provides error information on the divided frequency signal S2 from the VCO as counted by the frequency counter 43 with respect to the reference value SR corresponding to the center frequency.

The calculated output of the adder 50 is fed to a digital filter 51 for filtering. The output of the digital filter 51 is converted by a D/A converter 52 to an analog signal serving as a frequency error signal $S_{FE}$ that is sent to the adder 53.

The adder 53 adds up two inputs: the frequency error signal $S_{FE}$ from the D/A converter 52, and the error signal $S_{PO}$ acquired by the low-pass filter 48 filtering the compared output of the phase comparator 47. The output of the adder 53 is inputted as a controlled voltage Sc to the VCO 44.

With the PLL circuit constituted as described and incorporated illustratively in a reproducing apparatus, the following may occur: when the reproducing apparatus is turned on, scratches or dirt on the disk surface may typically result in focus servo errors or tracking servo errors, leading to the detection of a temporarily or perpetually dropped-out EFM signal that should be inputted to the phase comparator 47. In that case, the PLL circuit is switched to adjusting mode in which a center frequency for the VCO is readjusted.

In adjusting mode, the EFM signal to be inputted to the phase comparator 47 for comparison is switched to and replaced by an input signal fixed to the high or low level. This arrangement causes the EFM signal input side of the phase comparator 47 to be considered to have no signal. With no EFM signal received, the phase comparator 47 outputs no signal either.

At the same time, the switch SW1 is kept on in adjusting mode. In this state, the frequency counter 43 supplies the adder 50 via the switch SW1 with the frequency count result signal $S_{FO}$ representing the frequency counted on the basis of the divided frequency signals S1 and S2 coming from the crystal oscillator 41 and VCO 44 respectively. The adder 50 compares the input signal with the reference value from the reference value register 49. The added result is sent to the adder 53 eventually as the frequency error signal $S_{FE}$.

In the case above, the adder 53 is not supplied with any output of the phase comparator 47. It follows that the controlled voltage Sc from the adder 53 is composed of the frequency error signal $S_{FE}$ alone. The VCO 44 is controlled only by a feedback loop involving the frequency error signal $S_{FE}$ in such a manner that the divided frequency signal S2 outputted by the VCO 44 may approach the reference value SR in the reference value register 49. That is the oscillation frequency of the VCO 44 is controlled to approach the center frequency predetermined as appropriate. When the oscillation frequency of the VCO 44 is controlled as described, a suitable center frequency is established for the VCO 44 in adjusting mode.

In normal operation mode that follows adjusting mode, the phase comparator 47 receives a binary EFM signal retrieved from the disk, while the switch S1 is held off. The adder 53 receives the error signal $S_{PO}$ from the low-pass filter 48, the signal having been obtained on the basis of the difference in phase between the EFM signal and the divided frequency signal S2 from the VCO 44. The frequency error signal $S_{FE}$ is the final value being held since the previous adjusting mode. This frequency error signal $S_{FE}$ is sent to the adder 53. The final value in adjusting mode is retained by a register (not shown) furnished in the digital filter 51.

The PLL circuit in normal operation mode thus controls the frequency of the VCO 44 variably by use of the controlled voltage Sc acquired by combining the error signal $S_{PO}$ with the frequency error signal $S_{FE}$. The control operation ensures a zero phase difference between the divided frequency signal S2 from the VCO 44 and the EFM signal.

With the PLL circuit locked in normal operation mode, the divided frequency signal S2 from the VCO 44 is a regenerative clock signal in synchronism with the EFM signal. This regenerative clock signal is utilized as a processing clock signal by regenerative circuits as needed.

The phase comparator 47 is known to output a detection signal with a slight deviation from the actual phase difference because of characteristic variations intrinsic in the components making up the comparator. For example, suppose that when signals actually inputted to the phase comparator 47 have a zero phase difference therebetween, the phase comparator 47 outputs positive or negative detection pulses with a duty factor of 50% representing the zero phase difference. In that case, the duty factor of the output positive or negative pulses can actually develop a deviation attributable to constant errors or other characteristic variations intrinsic to the components constituting the phase comparator 47.

As a result, the EFM signal inputted to the PLL circuit of FIG. 1 in adjusting mode is regarded as nonexistent as described above. It is with no detection signal outputted by the phase comparator 47 that the center frequency is to be established. In such a setup for center frequency adjustment, any errors intrinsic in the phase comparator 47 are obviously not included.

Suppose now that adjusting mode in which the center frequency of the VCO 44 was established is then replaced by normal operation mode in which the phase comparator 47 receives the input EFM signal for phase comparison. In that case, the error signal $S_{PO}$, i.e., detection output of the phase comparator 47, includes an error intrinsic to the comparator. It follows that the controlled voltage Sc from the adder 53 also includes the error of the phase comparator 47.

In normal operation mode, the PLL circuit operates with the error of the phase comparator 47 left included. The implicit error is interpreted by the PLL circuit as a phase difference. The PLL circuit, when operating under the influence of that error, can eventually develop a capture range deviation or a lock range variation.

In addition, the EFM signal may drop out temporarily due to scratches or dirt on the storage medium, causing normal operation mode to be replaced again by adjusting mode for readjustment. In such a case, the center frequency of the VCO 44 may shift.

These difficulties can worsen the error rate in effect during signal retrieval from the storage medium or lower the capability of recovery from temporary EFM signal dropouts. The problems tend to detract from the reliability of the reproducing apparatus in the stage of its commercialization.

SUMMARY OF THE INVENTION

It is therefore an object of the present invention to overcome the above and other deficiencies and disadvantage of the prior art and to provide a PLL circuit and a reproducing apparatus for eliminating adverse effects of errors stemming from characteristic discrepancies in the circuit constitution of a phase comparator between two modes, one for adjusting a center frequency of a VCO and the other for carrying out normal PLL circuit operation, whereby the reliability of the PLL circuit and reproducing apparatus is enhanced upon commercialization.

In carrying out the invention and according to one aspect thereof, there is provided a phase locked loop circuit comprising: a phase comparator for comparing in phase an input signal with an oscillation frequency outputted by a voltage controlled oscillator; a first switcher for selecting as the input signal either a synchronizing signal of a predetermined kind or a divided oscillation frequency acquired and outputted by a divider dividing the oscillation frequency from the voltage controlled oscillator, the divider having a predetermined dividing ratio; a frequency counter for counting the oscillation frequency from the voltage controlled oscillator; a frequency error detector for detecting any error in counts made by the frequency counter with respect to a predetermined reference value so as to output error information reflecting any detected error; a second switcher for switching between connection and disconnection of the frequency counter to and from the frequency error detector; a variable control signal supplying device for combining comparison result information from the phase comparator with the error information from the frequency error detector in order to form a composite signal, the variable control signal supplying device further inputting the composite signal to the voltage controlled oscillator as an oscillation frequency variable control signal; and a controller for causing the first switcher to select the divided output from the divider as the input signal to the phase comparator, the controller further causing the second switcher to switch to the connection of the frequency counter to the frequency error detector, at least in adjusting mode in which a center frequency for the voltage controlled oscillator is established.

According to another aspect of the invention, there is provided a reproducing apparatus for retrieving and reproducing data recorded on a predetermined storage medium, the reproducing apparatus having a phase locked loop circuit comprising: a phase comparator for comparing in phase an input signal with an oscillation frequency outputted by a voltage controlled oscillator; a first switcher for selecting as the input signal either a synchronizing signal extracted on the basis of data retrieved from the storage medium, or a divided oscillation frequency acquired and outputted by a divider dividing the oscillation frequency from the voltage controlled oscillator, the divider having a predetermined dividing ratio; a frequency counter for counting the oscillation frequency from the voltage controlled oscillator; a frequency error detector for detecting any error in counts made by the frequency counter with respect to a predetermined reference value so as to output error information reflecting any detected error; a second switcher for switching between connection and disconnection of the frequency counter to and from the frequency error detector; a variable control signal supplying device for combining comparison result information from the phase comparator with the error information from the frequency error detector in order to form a composite signal, the variable control signal supplying device further inputting the composite signal to the voltage controlled oscillator as an oscillation frequency variable control signal; and a controller for causing the first switcher to select the divided output from the divider as the input signal to the phase comparator, the controller further causing the second switcher to switch to the connection of the frequency counter to the frequency error detector, at least in adjusting mode in which a center frequency for the voltage controlled oscillator is established; wherein the oscillation frequency from the voltage controlled oscillator is outputted as a regenerative clock signal.

When any of the above embodiments of the invention is in adjusting mode in which the center frequency is to be established, the phase comparator receives for phase comparison both the oscillation frequency of the voltage controlled oscillator and the divided oscillation frequency derived therefrom. The arrangement makes it possible for the center frequency to be automatically adjusted in consideration of errors intrinsic to the internal circuit constitution of the phase comparator.

Other objects, features and advantages of the invention will become more apparent upon a reading of the following description and appended drawings.

BRIEF DESCRIPTION OF THE DRAWINGS

FIG. 3, 3A and 3B are block diagrams of a phase locked loop circuit embodying the invention; and FIG. 4 is a transition table showing settings of switches SW1 and SW2 included in FIG. 3.

DESCRIPTION OF THE PREFERRED EMBODIMENTS

Figure 2:
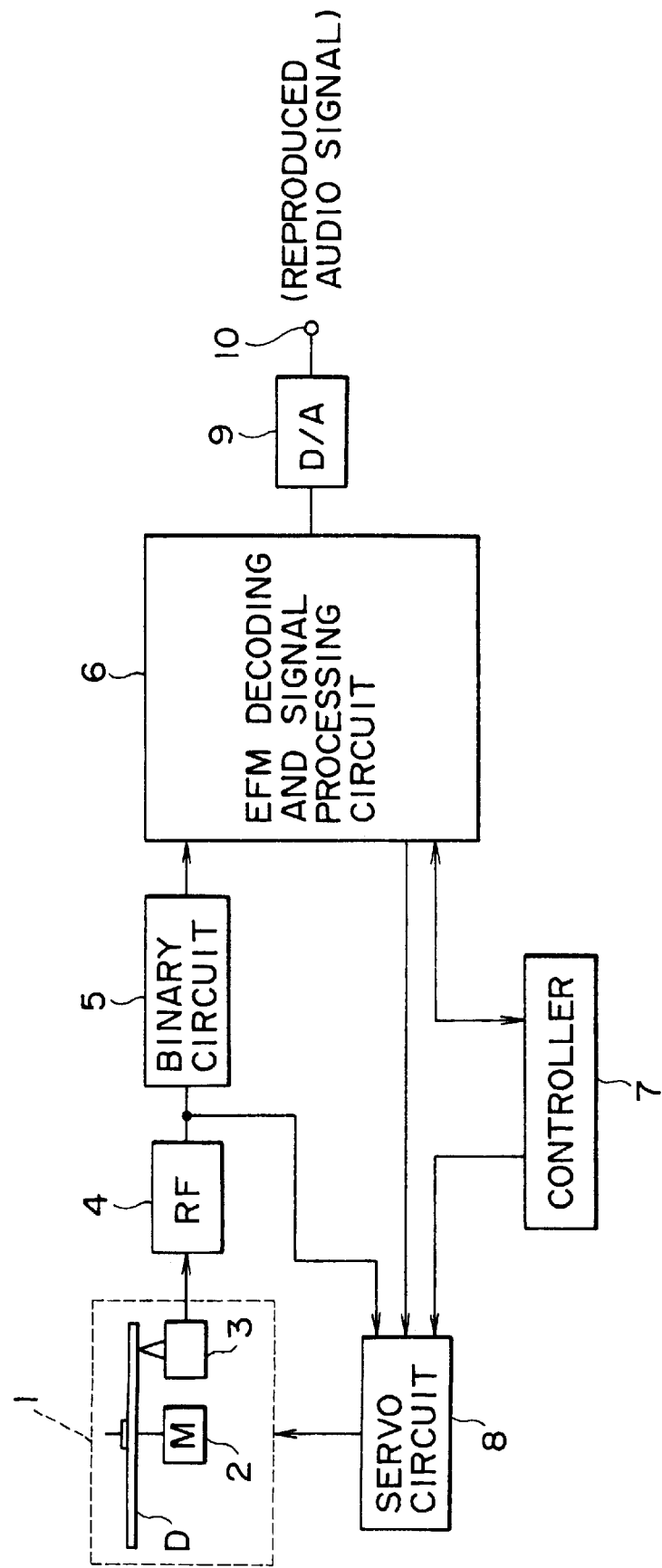
FIG. 2 is a block diagram of a reproducing apparatus embodying the invention for use with a phase locked loop circuit.

FIG. 2 is a block diagram of a reproducing apparatus practiced as a preferred embodiment of the invention. This embodiment will now be described. This is an audio reproducing apparatus capable of reproducing data at least from a CD (compact disk).

FIG. 2 shows key blocks of the reproducing apparatus embodying the invention. A disk D inserted in the reproducing apparatus of FIG. 1 is loaded into a disk driver 1 that drives the disk for data reproduction.

Figure 1:
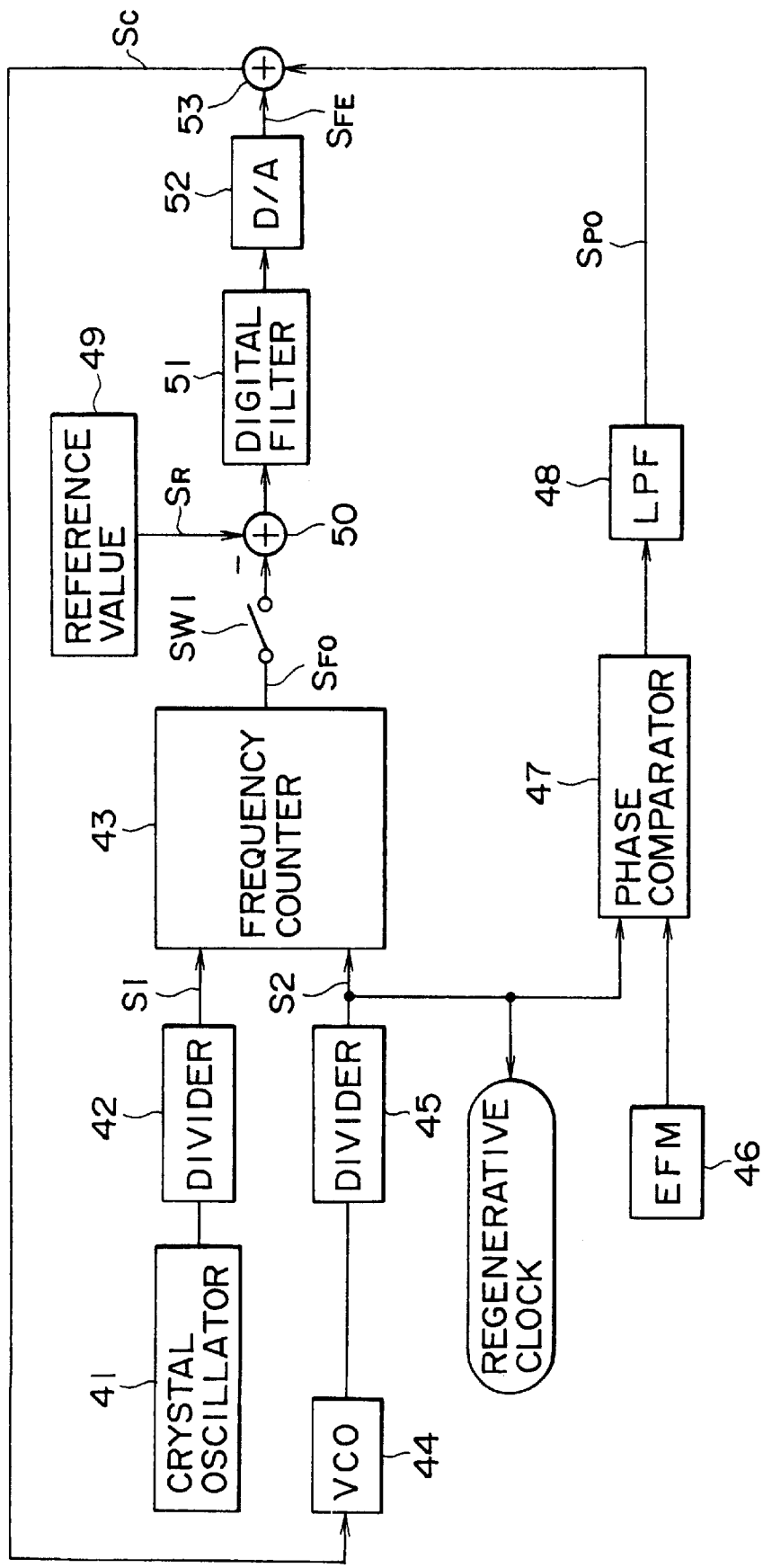
FIG. 1 is a block diagram of a related art phase locked loop circuit.

The disk driver 1 in FIG. 1 comprises a loading mechanism that loads and ejects a disk, a spindle motor 2 that acts as a disk rotating and driving mechanism, and an optical pickup mechanism 3. In operation, the loaded disk is rotated by the spindle motor 2 according to the CAV (constant angular velocity) or CLV (constant linear velocity) method. In that state, the optical pickup mechanism 3 applies a laser beam to the disk surface and acquires a detection signal representing the reflecttion light reflected from the disk. This causes data to be read from the disk D.

An electric current signal denoting detected information from the reflected light is sent from the optical pickup mechanism 3 to an RF matrix amplifier 4. The RF matrix amplifier 3 subjects the received signal to current-voltage conversion, amplification and arithmetic processing, whereby various signals are generated.

The RF matrix amplifier 4 generates a reproduced RF signal, a focus error signal and a tracking error signal. These outputs of the RF matrix amplifier 4 are fed to a binary circuit 5 and a servo circuit 8.

The binary circuit 5 binarizes the reproduced RF signal from the RF matrix amplifier 4 and forwards the binarized output to an EFM decoding and signal processing circuit 6. The EFM decoding and signal processing circuit 6 subjects the received binary EFM signal to EFM demodulation, error correction and other necessary signal processing, thereby decoding the retrieved signal from the disk into digital audio data. Furthermore, the EFM decoding and signal processing circuit 6 extracts sub-code and address data as well as revolution velocity data from the received EFM signal. The extracted data are sent to a controller 7 and the servo circuit 8.

The embodiment has a PLL circuit included in the EFM decoding and signal processing circuit 6. The PLL circuit extracts a regenerative clock signal from the input EFM signal and outputs the extracted signal to appropriate functional circuits. These functional circuits, not shown, perform read-related operations using the timing based on the regenerative clock signal.

Audio signal data outputted by the EFM decoding and signal processing circuit 6 is converted by a D/A converter 9 to an analog audio signal. The analog audio signal thus acquired is fed to an audio signal output terminal 10.

The servo circuit 8 generates various servo drive signals such as focus, tracking, sled and spindle signals based on the focus error signal and tracking error signal from the RF matrix amplifier 4 as well as on the basis of spindle error signals from the EFM decoding and signal processing circuit 6. The signals thus generated cause the disk driver 1 to carry out servo actions related to disk data reproduction.

The controller 7 comprises a microcomputer and a RAM (random access memory). It controls diverse data read operations of the reproducing apparatus.

Figure 3A:
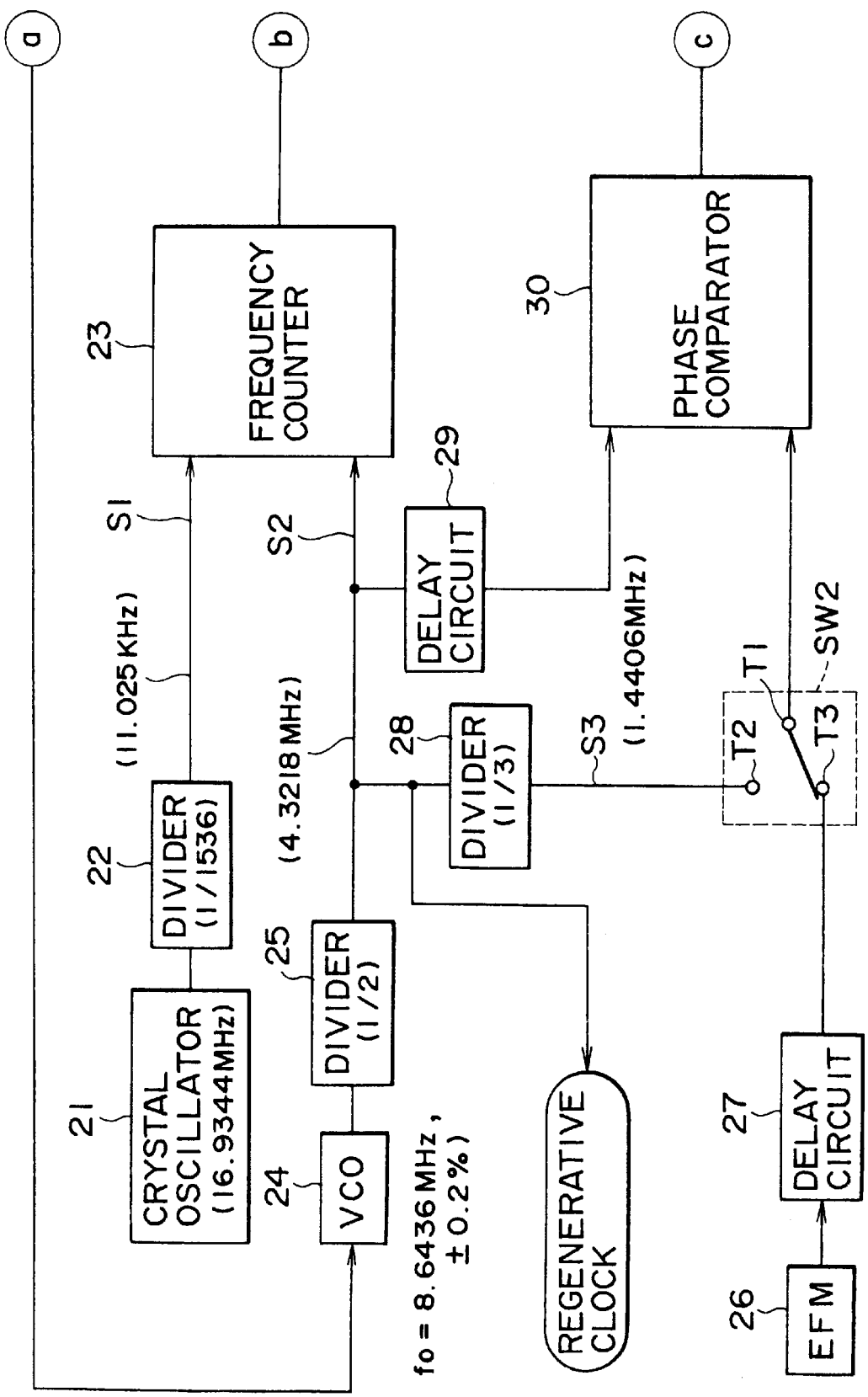

The block diagram of FIG. 3 shows a typical constitution of the PLL circuit included in the EFM decoding and signal processing circuit 6. The PLL circuit in FIG. 3 is furnished so as to extract the regenerative clock signal from the binary EFM signal based on the reproduced RF signal.

In FIG. 3, a crystal oscillator 21 outputs a reference oscillation frequency determined by a built-in crystal resonator. Illustratively, the reference oscillation frequency of the crystal oscillator 21 is 16.9344 MHz. The reference frequency outputted by the crystal oscillator 21 is divided by a divider 22 having a dividing ratio of, say, 1/1536. The result is a divided frequency signal S1 with a frequency of 11.025 kHz that is inputted to a frequency counter 23.

A voltage controlled oscillator (VCO) 24 has its oscillation frequency controlled by the output of an adder 37, to be described later. With this embodiment, the VCO 24 has its oscillation frequency varied illustratively within the range of ±2% with respect to a center frequency ($f_o$) of 8.6436 MHz.

The oscillation output of the VCO 24 is divided by a divider 25 having a dividing ratio of, say, 1/2. The result of the division is a divided frequency signal S2 with a frequency of 4.3218 MHz. The divided frequency signal S2 is branched and supplied to the frequency counter 23, to a delay circuit 29 and to a divider 28.

The divided frequency signal S2 is a bit clock signal synchronized consequently with the EFM signal. As such, the divided frequency signal S2 is used as a regenerative clock signal by applicable functional circuits for processing inside the reproducing apparatus.

The delay circuit is a delay element that has a delay time coinciding with the time it takes for the signal input to the divider 28 to be divided and output. The divided frequency signal S2 that has passed through the delay circuit 29 is inputted to a phase comparator 30.

The divider 28 has a dividing ratio of 1/3. As a result, the divided frequency signal S3 past the divider 28 turns out to be a signal having a one-sixth of the oscillation frequency of the VCO 24. Thus the divided frequency signal S3 varies in reference to the frequency of 8.6436 MHz/6=1.4406 MHz. The signal S3 is fed to a terminal T2 of a switch SW2, to be described later.

An EFM block 26 is equivalent to a group of components 1 through 5, i.e., up to the binary circuit 5 shown in FIG. 2. The EFM block 26 outputs a binarized EFM signal based on the reproduced RF signal read from the disk D. The binary EFM signal is sent to a terminal T3 of the switch SW2 by way of a delay circuit 27. Like the delay circuit 29 mentioned above, the delay circuit 27 is a delay element that has a delay time coinciding with the time required by the divider 28 to perform its signal processing.

The switch SW2 functioning illustratively under control of the controller 7 has its terminal T1 connected selectively to either the terminal T2 or the terminal T3 inside depending on the operation of the PLL circuit, as will be described later. The terminal T1 of the switch SW1 is connected to the input of the phase comparator 30. In this setup, if the terminal T1 is connected to the terminal T2 in the switch SW2, then the phase comparator 30 receives the divided frequency signal S3 (1.4406 MHz) acquired by the dividers 25 and 28 dividing the oscillation frequency of the VCO 24 using the dividing ratio of 1/6. If the terminal T1 is connected to the terminal T3, then the binary EFM signal is inputted via the delay circuit 27.

One input of the phase comparator 30 receives the divided frequency signal S2 coming from the delay circuit 29, and the other input accepts via the switch SW2 either the divided frequency signal S3 (1.4406 MHz) from the VCO 24 or the EFM signal.

The phase comparator 30 compares the received signals in terms of phase and feeds its detection output to a low-pass filter 31. The low-pass filter 31 filters the detection output from the phase comparator 30 and sends an error signal $S_{PO}$ to an adder 37 accordingly.

The frequency counter 23 counts the frequency of the divided input from the VCO 24. The counting is done by comparing the divided frequency signal S1 from the crystal oscillator 21 with the divided frequency signal S2 from the VCO 24. In this embodiment, the frequency counter 23 is a known counter that illustratively counts how many times the cycle of the divided frequency signal S2 occurs in each cycle of the divided frequency signal S1 (11.025 kHz). The divided frequency signal S2, which varies in reference to the center frequency of 4.3218 MHz, has its count result output as "392" by the frequency counter 23 when the divided frequency signal S2 is exactly 4.3218 MHz. That is, 4321.8/11.015=392.

With the above embodiment, the count result signal $S_{FO}$ resulting from the frequency counter 23 is supplied to a register 32 via the switch SW1. The switch SW1 has its on/off status controlled illustratively by the controller 7 depending on conditions that will be described later.

When receiving the count result signal $S_{FO}$ from the frequency counter 23 with the switch SW1 turned on, the register 32 has its content continuously updated every time the signal $S_{FO}$ is admitted. The content of the register 32 is sent to an adder 34. When not receiving the count result signal $S_{FO}$ from the frequency counter 23 with the switch SW1 turned off, the register 32 holds the last input value in effect before the switch SW1 was turned off. The value thus held is also supplied to the adder 34.

In the arrangement above, a reference value register 33 is set illustratively with the reference value SR of 392, i.e., the same as the above-described count value. That is, when the divided frequency signal from the VCO 24 has the frequency of 4.3218 MHz, the reference value register 33 is set with the value obtained as the count result signal $S_{FO}$ from the frequency counter 23. The reference value SR placed in the reference value register 33 thus corresponds to the appropriate center frequency (4.3218 MHz in this example) established for the VCO 24.

The adder 34 subtracts from the reference value SR the count result signal $S_{FO}$ coming from the frequency counter 23. The result of the subtraction represents an error of the count result signal $S_{FO}$ with respect to the reference value SR. The error information indicates how much the oscillation frequency of the VCO 24 deviates from the center frequency.

The calculated result from the adder 34 is filtered by a digital filter 35 before being converted by a D/A converter 36 into an analog voltage value. The converted voltage value is sent to the adder 37 as the frequency error signal $S_{FE}$.

The adder 37 adds up two signals: the frequency error signal $S_{FE}$, and the error signal $S_{PO}$ that is a voltage value corresponding to the compared result from the phase comparator 30. The result of the addition is inputted as a controlled voltage Sc to the VCO 24.

What follows is a description that is how the inventive PLL circuit of the above constitution works. FIG. 4 shows how the settings of the switches SW1 and SW2 correspond to the modes in which the PLL circuit of the embodiment operates. As listed in FIG. 4, the inventive PLL circuit operates in one of at least three operation modes: adjusting mode, normal operation mode, and sustaining mode.

Adjusting mode is a mode reached when it becomes necessary to adjust the center frequency of the VCO 24. The need arises in such cases as power-up and starting of the spindle motor following power application, or when the EFM signal is not available over an extended period of time because of various servo errors.

Normal operation mode is a mode in which the EFM signal is continuously available illustratively when read operations are normally carried out on the disk D. Sustaining mode is reached when the clock regenerating action needs to be sustained even if the EFM signal is not available during temporary EFM signal drop-outs attributable to scratches or dirt on the disk surface.

As shown in FIG. 4, the PLL circuit in adjusting mode has the switch SW1 turned on and has the terminal T1 connected to the terminal T2 in the switch SW2. In that state, connecting the terminals T1 with T2 in the switch SW2 allows the phase comparator 30 to receive both the divided frequency signal S2 from the VCO 24 via the delay circuit 29 and the divided frequency signal S3, i.e, one-sixth of the oscillation frequency of the VCO 24 as acquired by the dividers 25 and 28. The signals S2 and S3 are compared for a phase difference. It should be noted that the divided frequency signals S2 and S3 inputted to the phase comparator 30 originate from the same oscillation frequency of the VCO 24. The divided frequency signal S2 is inputted to the phase comparator 30 after being delayed by the delay circuit 29 whose delay time is established so as to coincide with the signal processing time of the divider 28, the divider being furnished to generate the divided frequency signal S3. As a result, the divided frequency signals S2 and S3 have a zero phase difference in practical terms.

The phase comparator 30 should detect no phase difference between the divided frequency signals S2 and S3 received. At this point, characteristic variations intrinsic to the elements constituting the phase comparator 30 result in an error that remains in a detection signal from the comparator.

Even if a zero phase difference signal is actually inputted in adjusting mode, the detection signal from the phase comparator 30 necessarily includes a phase difference representing the error attributed to the internal circuit constitution of the comparator.

More specifically, suppose that the phase comparator 30 of the above embodiment outputs as the detection signal a positive/negative detection pulse signal with a duty factor of 50% when the two input signals match in phase. In that case, when the divided frequency signals S2 and S3 are compared for a phase difference, the duty factor of the positive/negative detection pulse signal comprises a deviation corresponding to the above-mentioned error.

The switch SW1 is turned on in adjusting mode. This causes the adder 37 to be fed with the frequency error signal $S_{FE}$ that corresponds to the error between the reference value VR and the divided frequency signal S2 from the VCO 24 as counted presently by the frequency counter 43.

At this point, the adder 37 generates the controlled voltage Sc by combining the error signal $S_{PO}$ based on the detection signal from the phase comparator 47 with the frequency error signal $S_{FE}$. The basic operation of the PLL circuit here consists in varying the oscillation frequency of the VCO 24 by use of the controlled voltage Sc acquired by combination of the error signal $S_{PO}$ with the frequency error signal $S_{FE}$ so that the divided frequency signal S2 of the VCO 24 as counted by the frequency counter will approach 4.3218 kHz (reference value). That is, the center frequency f0 is set to 8.6436 MHz for the VCO 24.

The error signal $S_{PO}$, a component of the controlled voltage Sc, includes the error of the phase comparator 30. For that reason, the center frequency established for the VCO 24 in adjusting mode of the embodiment is considered to have absorbed that intrinsic circuit error of the phase comparator 30 which is contained in the error signal $S_{PO}$.

When adjusting mode is finished in which the center frequency was set approximately to 4.3218 kHz for the VCO 24, subsequent operations such as data read operations take place in normal operation mode as long as data is read normally.

In normal operation mode, the switch SW1 is turned off, with the terminals T1 and T3 connected in the switch SW2, as indicated in FIG. 4.

Where the switch SW1 is turned off, the register 32 holds the value of the count result signal $S_{FO}$ last counted by the frequency counter 23 in the previous adjusting mode. That is, the value in the register 32 represents the count result signal $S_{FO}$ acquired by having the oscillation frequency of the VCO 24 converging on the center frequency f0 in adjusting mode. The count result signal $S_{FO}$ here is considered to include that intrinsic circuit error of the phase comparator 30 which was contained in the error signal $S_{PO}$.

In normal operation mode, the error signal $S_{FO}$ generated on the basis of the value held in the register 32 is outputted continuously to the adder 37.

With the terminals T1 and T3 connected in the switch SW2, the phase comparator 30 is supplied with both the divided frequency signal S2 sent from the VCO 20 via the delay circuit 29 and the binary EFM signal past the delay circuit 27. The result of the phase comparison is inputted as the error signal $S_{PO}$ to the adder 37 by way of the low-pass filter 31. The delay circuit 27 has the same delay time as the delay circuit 29. This setup provides adjustments such that the divided frequency signal S2 from the VCO 24 as delayed by the delay circuit 29 and the EFM signal are inputted at appropriate times.

Conventionally, as shown in FIG. 1, the intrinsic error of the phase comparator 30 is included not in adjusting mode but in subsequent normal operation mode. That error appears as a phase difference. With the above embodiment, by contrast, the center frequency of the VCO 24 is established so that the error of the phase comparator 30 is co-opted in adjusting mode. The arrangement prevents the error of the phase comparator 30 from emerging as a phase difference when adjusting mode is replaced by normal operation mode. This in turn forestalls irregularities such as capture range deviations and lock range variations appearing in normal operation mode of the embodiment, allowing the PLL circuit to perform tracking operations at higher levels of precision than ever before.

The controller 7 sets up sustaining mode when detecting any temporary drop-out of the EFM signal read from the disk, typically attributable to scratches or dirt on the disk surface. In that case, as shown in FIG. 4, the switch SW1 is turned off and the terminals T1 and T2 are connected in the switch SW2 under control of the controller 7.

The adder 37 is supplied with the frequency error signal $S_{FE}$ generated on the basis of the value which was in effect in the previous adjusting mode and which is currently held in the register 32. At the same time, the phase comparator 30 is fed with both the frequency controlled signal S2 coming from the VCO 24 via the delay circuit 29 and the divided frequency signal S3 obtained by the divider 28 dividing the signal S2.

Thus the error signal $S_{PO}$ output to the adder 37 has a zero phase difference including the intrinsic circuit error of the phase comparator 30 as in adjusting mode. In turn, the VCO 24 has its oscillation frequency controlled to approach the center frequency by the controlled voltage Sc containing the error component. It follows that unlike the PLL circuit of FIG. 1, the inventive PLL circuit does not develop a center frequency deviation during EFM signal drop-outs.

As described, the embodiment has its PLL circuit operating so as to absorb any error component of the detection signal from the phase comparator in any of adjusting mode, normal operation mode and sustaining mode, the error component being attributable to the intrinsic circuit error of the comparator. It will be appreciated that the embodiment of the invention thus operates in a continuously stable manner regardless of the presence or absence of EFM signal inputs.

The preferred embodiment described above is not limitative of the invention and is conducive to many changes and variations depending on actual use conditions. For example, in addition to the CD player cited above as the typical reproducing apparatus, the invention may be applied to other disk type storage medium reproducing apparatuses such as magneto-optical disk players. The invention may also be applied advantageously to reproducing apparatuses dealing with storage media different from disks such as tapes.

Furthermore, the PLL circuit of the invention is not limited to the specific circuit constitution described above. Various changes and modifications may also be made. Illustratively, the frequencies of output signals from diverse components making up the PLL circuit may vary depending on the type of reproducing apparatus to which the invention is applied. The synchronizing signal inputted to the phase comparator is not limited to the EFM signal. In addition, the invention is not limited to the PLL circuit that carries out clock regeneration in the reproducing apparatus; the invention may be applied as well to any PLL circuits used in applications where automatic adjustment of the center frequency is desirable.

As described, the PLL circuit according to the invention is capable of automatically adjusting the center frequency of the VCO and thereby absorbing any error in the detection output of the phase comparator regardless of the presence or absence of the input signal, the error being attributed to characteristic variations intrinsic to the components constituting the comparator. Such capabilities of the inventive PLL circuit significantly reduce the possibility or the degree of lock range deviations, capture range variations or center frequency shifts during normal operation of the PLL circuit or upon center frequency readjustments necessitated by temporary drop-outs of the synchronizing signal. Thus the PLL circuit continues to operate in a stable manner.

When a reproducing apparatus incorporates the inventive PLL circuit for clock regeneration, the reproducing apparatus has an enhanced ability to lower read data error rates and to recover from temporary signal drop-outs. This means that the reproducing apparatus taking advantage of this PLL circuit is more reliable in performance, i.e., better equipped to reproduce data consistently from the storage medium.

As many apparently different embodiments of this invention may be made without departing from the spirit and scope thereof, it is to be understood that the invention is not limited to the specific embodiments thereof, except as defined in the appended claims.

What is claimed is:

1. A phase locked loop circuit comprising:

phase comparing means for comparing in phase an input signal with an oscillation frequency outputted by voltage controlled oscillating means;

first switching means for selecting as said input signal either a synchronizing signal of a predetermined kind or a divided oscillation frequency acquired and outputted by dividing means dividing said oscillation frequency from said voltage controlled oscillating means, said dividing means having a predetermined dividing ratio;

frequency counting means for counting said oscillation frequency from said voltage controlled oscillating means;

frequency error detecting means for detecting any error in counts made by said frequency counting means with respect to a predetermined reference value so as to output error information reflecting any detected error;

second switching means for switching between connection and disconnection of said frequency counting means to and from said frequency error detecting means;

variable control signal supplying means for combining comparison result information from said phase comparing means with said error information from said frequency error detecting means in order to form a composite signal, said variable control signal supplying means further inputting said composite signal to said voltage controlled oscillating means as an oscillation frequency variable control signal; and controlling means for causing said first switching means to select the divided output from said dividing means as said input signal to said phase comparing means, said controlling means further causing said second switching means to switch to the connection of said frequency counting means to said frequency error detecting means, at least in adjusting mode in which a center frequency for said voltage controlled oscillating means is established.

2. A phase locked loop circuit according to claim 1, further comprising information storing means for storing count result information from said frequency counting means in said adjusting mode;

wherein said controlling means, in normal operation mode, causes said first switching means to select said synchronizing signal so that the selected signal is supplied as said input signal to said phase comparing means, said controlling means further causing said second switching means to switch to the disconnection of said frequency counting means from said frequency error detecting means so that said count result information stored in said frequency information storing means is supplied to said frequency error detecting means.

3. A phase locked loop circuit according to claim 1, further comprising information storing means for storing count result information from said frequency counting means in said adjusting mode;

wherein said controlling means, if said synchronizing signal is not available, causes said first switching means to select the divided output from said dividing means as said input signal to said phase comparing means, said controlling means further causing said second switching means to switch to the disconnection of said frequency counting means from said frequency error detecting means so that said count result information stored in said frequency information storing means is supplied to said frequency error detecting means.

4. A phase locked loop circuit according to claim 1, wherein said synchronizing signal is extracted on the basis of data retrieved from a storage medium of a predetermined kind.

5. A phase locked loop circuit according to claim 1, further comprising:

first delay means for delaying by a predetermined period of time that oscillation frequency of said voltage controlled oscillating means which is to be inputted to said phase comparing means; and second delay means for delaying said synchronizing signal by a predetermined period of time.

6. A phase locked loop circuit according to claim 5, wherein said first and said second delay means have a delay time substantially equal to a signal processing time of said dividing means.

7. A reproducing apparatus for retrieving and reproducing data recorded on a predetermined storage medium, said reproducing apparatus having a phase locked loop circuit comprising:

phase comparing means for comparing in phase an input signal with an oscillation frequency outputted by voltage controlled oscillating means;

first switching means for selecting as said input signal either a synchronizing signal extracted on the basis of data retrieved from said storage medium, or a divided oscillation frequency acquired and outputted by dividing means dividing said oscillation frequency from said voltage controlled oscillating means, said dividing means having a predetermined dividing ratio;

frequency counting means for counting said oscillation frequency from said voltage controlled oscillating means;

frequency error detecting means for detecting any error in counts made by said frequency counting means with respect to a predetermined reference value so as to output error information reflecting any detected error;

second switching means for switching between connection and disconnection of said frequency counting means to and from said frequency error detecting means;

variable control signal supplying means for combining comparison result information from said phase comparing means with said error information from said frequency error detecting means in order to form a composite signal, said variable control signal supplying means further inputting said composite signal to said voltage controlled oscillating means as an oscillation frequency variable control signal; and controlling means for causing said first switching means to select the divided output from said dividing means as said input signal to said phase comparing means, said controlling means further causing said second switching means to switch to the connection of said frequency counting means to said frequency error detecting means, at least in adjusting mode in which a center frequency for said voltage controlled oscillating means is established;

wherein said oscillation frequency from said voltage controlled oscillating means is output as a regenerative clock signal.

8. A reproducing apparatus according to claim 7, further comprising information storing means for storing count result information from said frequency counting means in said adjusting mode;

wherein said controlling means, in normal operation mode, causes said first switching means to select said synchronizing signal so that the selected signal is supplied as said input signal to said phase comparing means, said controlling means further causing said second switching means to switch to the disconnection of said frequency counting means from said frequency error detecting means so that said count result information stored in said frequency information storing means is supplied to said frequency error detecting means.

9. A reproducing apparatus according to claim 7, further comprising information storing means for storing count result information from said frequency counting means in said adjusting mode;

wherein said controlling means, if said synchronizing signal is not available, causes said first switching means to select the divided output from said dividing means as said input signal to said phase comparing means, said controlling means further causing said second switching means to switch to the disconnection of said frequency counting means from said frequency error detecting means so that said count result information stored in said frequency information storing means is supplied to said frequency error detecting means.

10. A reproducing apparatus according to claim 7, further comprising:

first delay means for delaying by a predetermined period of time that oscillation frequency of said voltage controlled oscillating means which is to be inputted to said phase comparing means; and second delay means for delaying said synchronizing signal by a predetermined period of time.

11. A reproducing apparatus according to claim 10, wherein said first and said second delay means have a delay time substantially equal to a signal processing time of said dividing means.

* * * * *